(12) United States Patent
Monoe et al.

(10) Patent No.: US 7,163,852 B2
(45) Date of Patent: Jan. 16, 2007

(54) MANUFACTURING METHOD FOR SEMICONDUCTOR DEVICE

(75) Inventors: Shigeharu Monoe, Kanagawa (JP); Takashi Yokoshima, Kanagawa (JP); Shinya Sasagawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 251 days.

(21) Appl. No.: 10/731,000

(22) Filed: Dec. 10, 2003

(65) Prior Publication Data
US 2004/0209409 A1    Oct. 21, 2004

(30) Foreign Application Priority Data
Dec. 18, 2002 (JP) .............................. 2002-366618

(51) Int. Cl.
*H01L 21/84* (2006.01)
(52) U.S. Cl. ...................................... 438/163
(58) Field of Classification Search ............... 438/163
See application file for complete search history.

(56) References Cited

U.S. PATENT DOCUMENTS

| 4,707,721 A | 11/1987 | Ang et al. |
| 4,963,504 A | 10/1990 | Huang |

(Continued)

FOREIGN PATENT DOCUMENTS

EP    1 128 430 A2    8/2001

(Continued)

OTHER PUBLICATIONS

Mishima et al., "Improved Lifetime of Poly-Si TFTs with a Self-aligned Gate-overlapped LDD Structure", Jun. 2002, IEEE Transactions on Electron Devices, vol. 49, No. 6, pp. 981-985.*

(Continued)

*Primary Examiner*—Evan Pert
(74) *Attorney, Agent, or Firm*—Nixon Peabody LLP; Jeffrey L. Costellia

(57) ABSTRACT

With respect to the selective ratio in the etching process, it is an object to give design freedom in size of an LDD overlapped with a gate electrode, which is formed in a self-aligning manner, by performing an etching process under an etching condition that has a high selective ratio between a mask pattern and metal such as titanium in forming a first conductive layer pattern. A laminated structure comprising a lower first conductive layer and an upper second conductive layer is formed over a semiconductor layer with a gate insulating film interposed therebetween, a mask pattern is formed on the laminated structure, a condition that an etching rate of the mask pattern is fast is used and the second conductive layer and the first conductive layer are etched to form a tapered first conductive layer pattern, and the second conductive layer in the first conductive layer pattern is selectively etched in accordance with the left mask pattern to form a second conductive layer pattern in which a width of the first conductive layer is longer than that of the second conductive layer.

16 Claims, 11 Drawing Sheets

U.S. PATENT DOCUMENTS

| | | | |
|---|---|---|---|
| 5,177,577 A | 1/1993 | Taniguchi et al. | |
| 5,445,710 A | 8/1995 | Hori et al. | |
| 5,498,573 A | 3/1996 | Whetten | |
| 5,583,067 A | 12/1996 | Sanchez | |
| 6,201,281 B1 | 3/2001 | Miyazaki et al. | |
| 6,235,558 B1 | 5/2001 | Oda et al. | |
| 6,596,571 B1* | 7/2003 | Arao et al. | 438/163 |
| 6,646,287 B1 | 11/2003 | Ono et al. | |
| 6,706,544 B1* | 3/2004 | Yamazaki et al. | 438/30 |
| 6,872,604 B1* | 3/2005 | Yamazaki et al. | 438/151 |
| 6,933,184 B1* | 8/2005 | Arao et al. | 438/163 |
| 2001/0030322 A1 | 10/2001 | Yamazaki et al. | |
| 2001/0035526 A1 | 11/2001 | Yamazaki et al. | |
| 2001/0041392 A1 | 11/2001 | Suzawa et al. | |
| 2001/0048408 A1* | 12/2001 | Koyama et al. | 345/76 |
| 2001/0052950 A1 | 12/2001 | Yamazaki et al. | |
| 2001/0055841 A1 | 12/2001 | Yamazaki et al. | |
| 2002/0000551 A1 | 1/2002 | Yamazaki et al. | |
| 2002/0048829 A1 | 4/2002 | Yamazaki et al. | |
| 2002/0102776 A1 | 8/2002 | Yamazaki et al. | |
| 2002/0163049 A1* | 11/2002 | Yamazaki et al. | 257/408 |
| 2003/0020118 A1* | 1/2003 | Kajiwara et al. | 257/347 |
| 2003/0062524 A1* | 4/2003 | Kimura | 257/72 |
| 2003/0100151 A1* | 5/2003 | Okamoto | 438/163 |
| 2004/0023478 A1 | 2/2004 | Samavedam et al. | |
| 2004/0087125 A1 | 5/2004 | Monoe | |
| 2004/0140472 A1* | 7/2004 | Fujimoto et al. | 257/72 |
| 2004/0171242 A1 | 9/2004 | Monoe et al. | |
| 2005/0181610 A1 | 8/2005 | Sasagawa et al. | |

FOREIGN PATENT DOCUMENTS

| | | |
|---|---|---|
| JP | 06-053324 | 2/1994 |
| JP | 10-012605 | 1/1998 |
| JP | 2000-269331 | 9/2000 |
| JP | 2000-294787 | 10/2000 |
| JP | 2001-313397 | 11/2001 |
| JP | 2002-14337 | 1/2002 |
| JP | 2003-257950 | 9/2003 |

OTHER PUBLICATIONS

Ohgata et al., "A new dopant activation technique for poly-Si TFTs with a self-aligned gate-overlapped LDD structure", Dec. 2000, IEDM Technical Digest, pp. 205-208.*

M. Wittmer et al., "Characteristics of TIN gate metal-oxide-semiconductor field effect transistors", J. Appl. Phys. vol. 54, No. 3, Mar. 1983, pp. 1423-1428.

U.S. Appl. No. 10/731,089, filed Dec. 10, 2003.

U.S. Appl. No. 10/777,117, filed Feb. 13, 2004.

* cited by examiner

[Fig. 1]
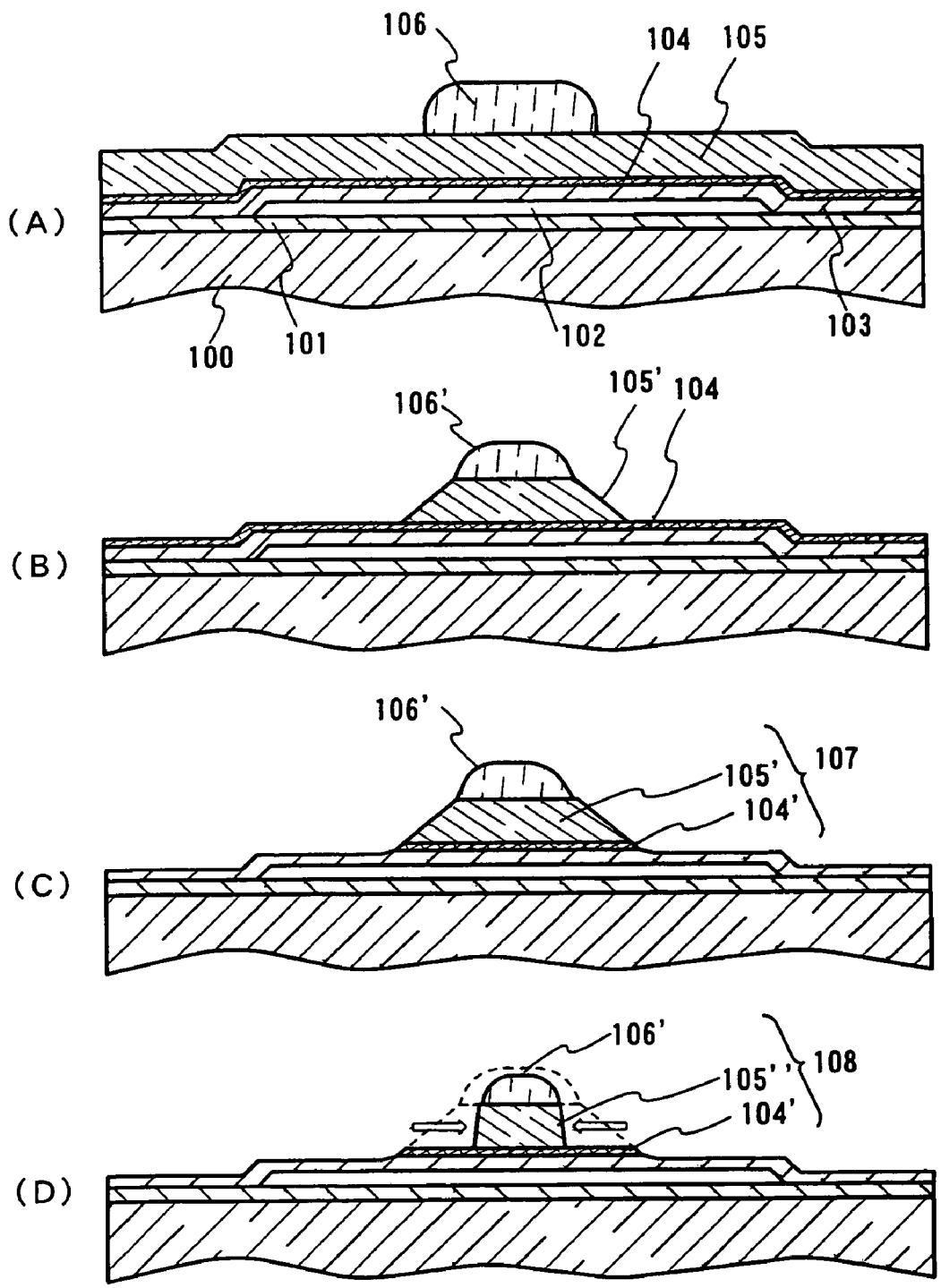

[Fig. 2]
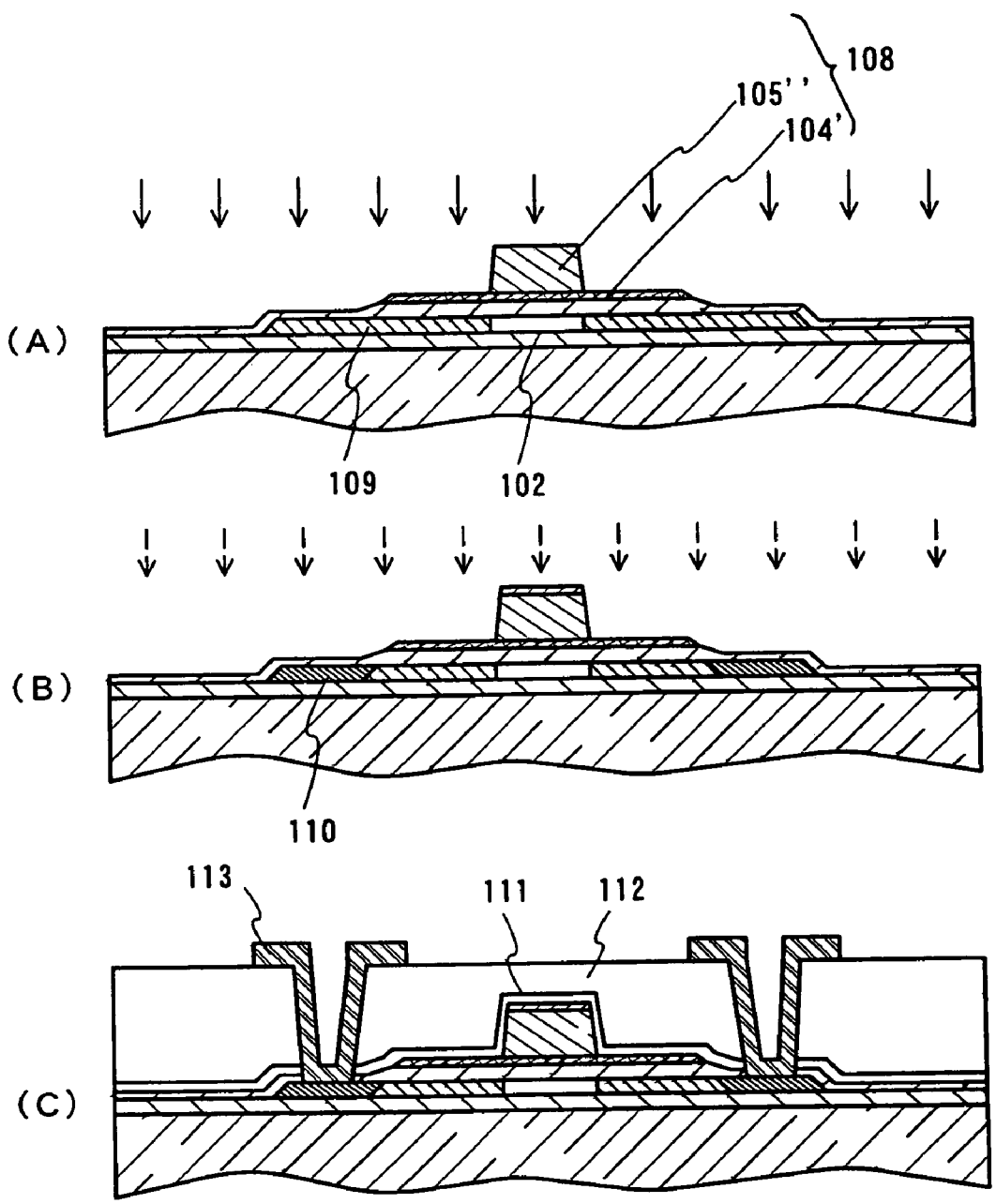

[Fig. 3]
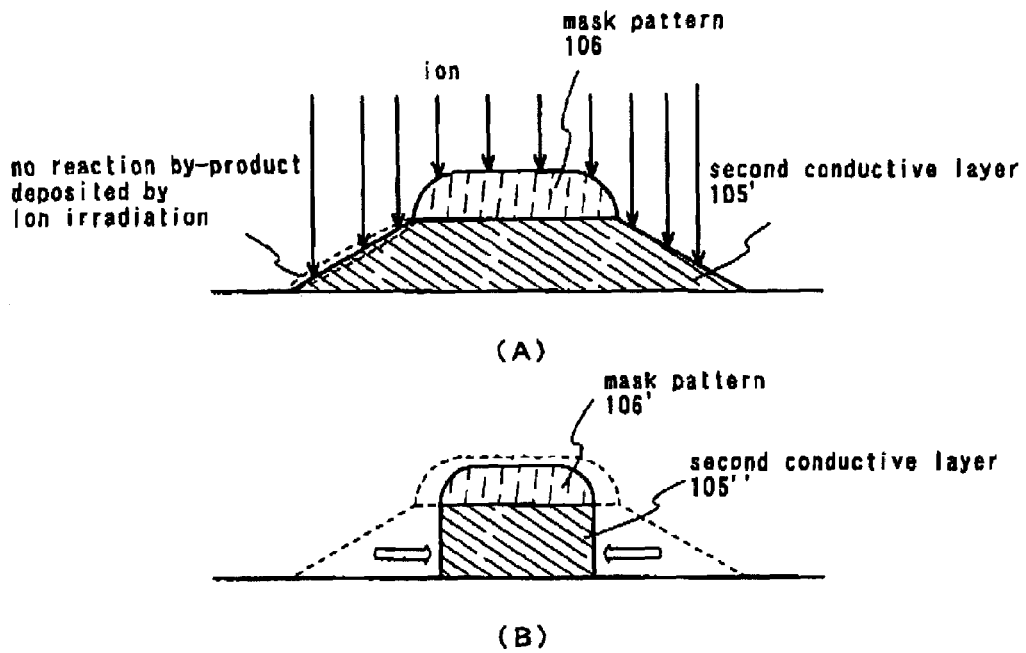
[Fig. 4]
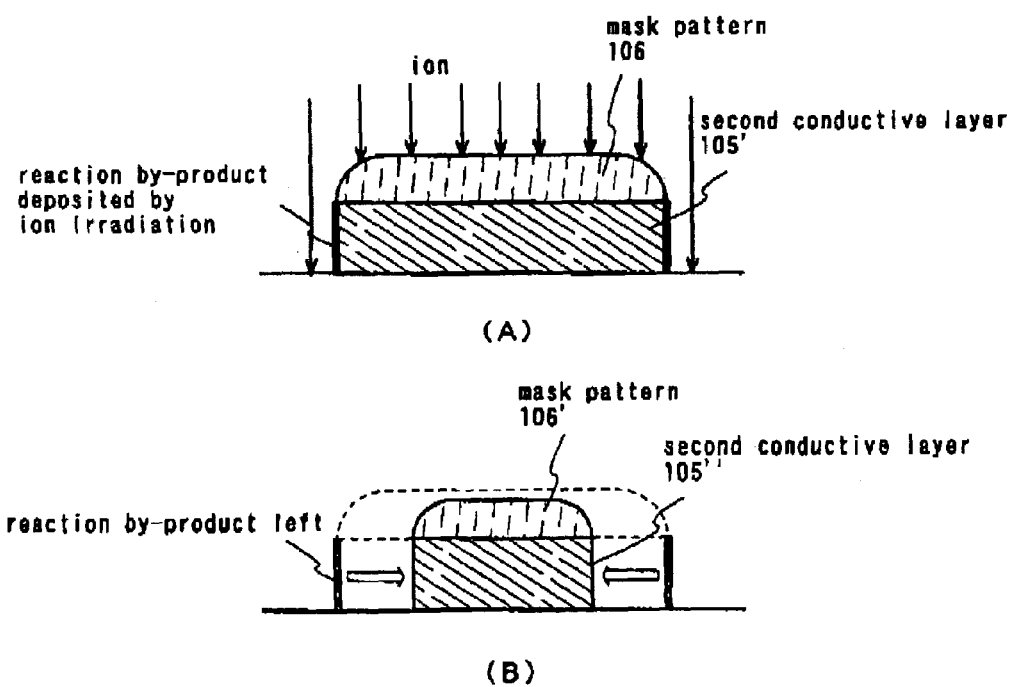

[Fig. 5]
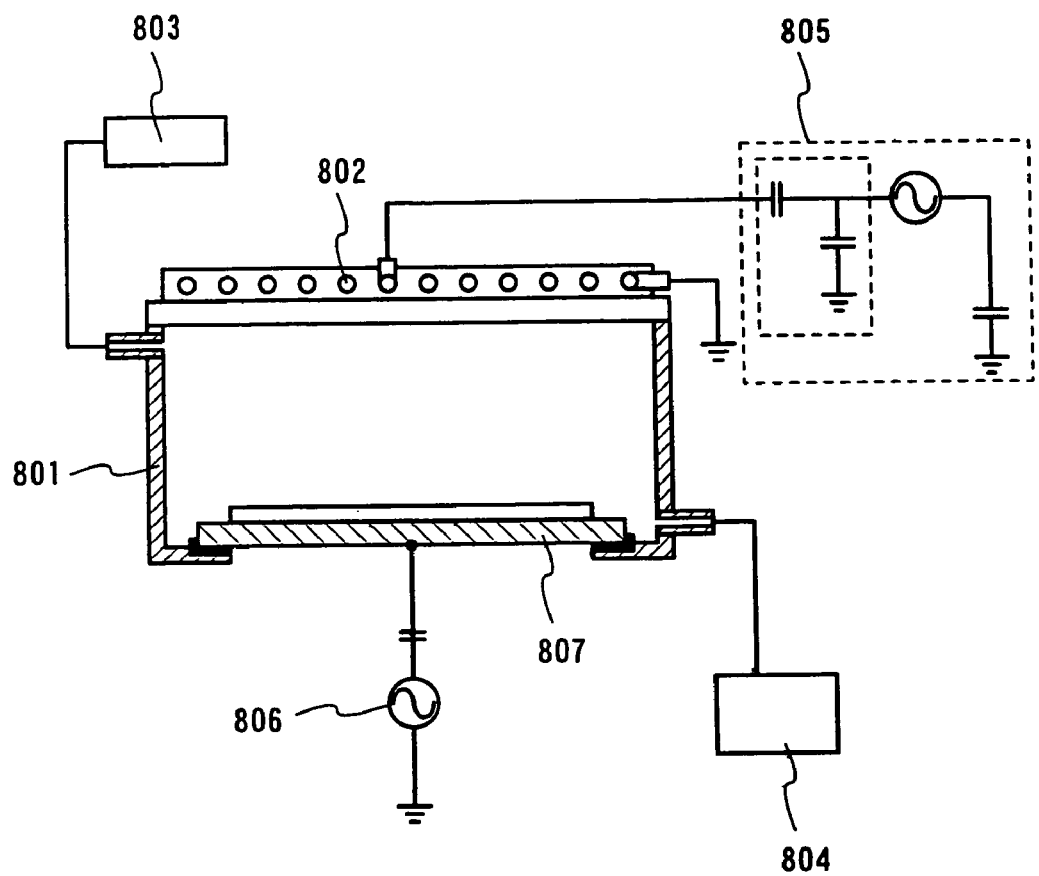

[Fig. 6]
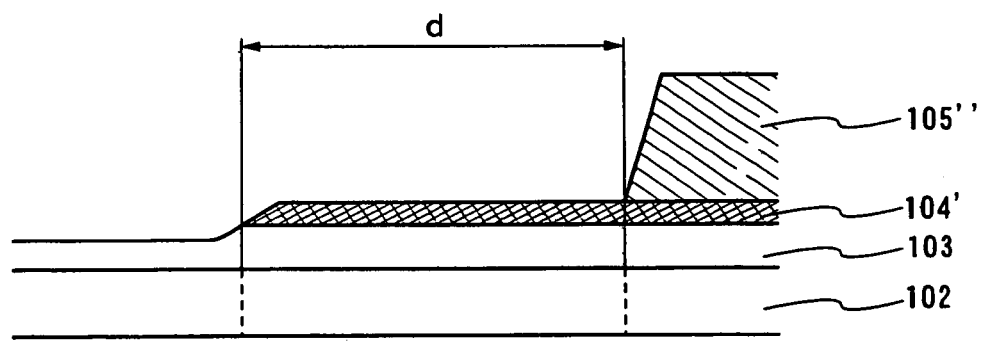

[Fig. 7]
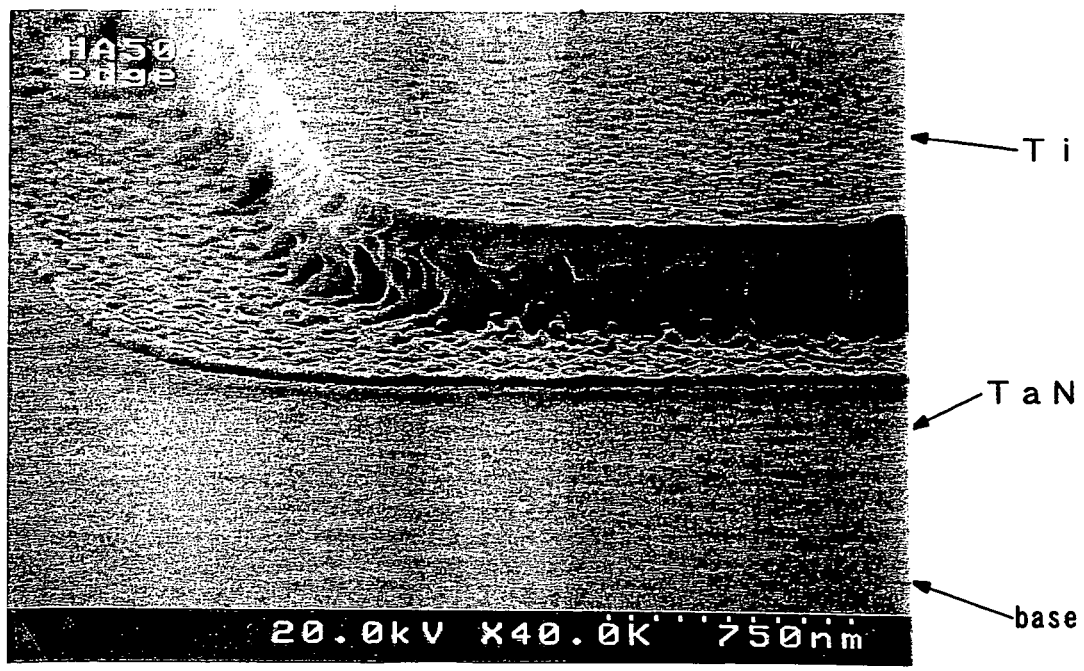

[Fig. 8]
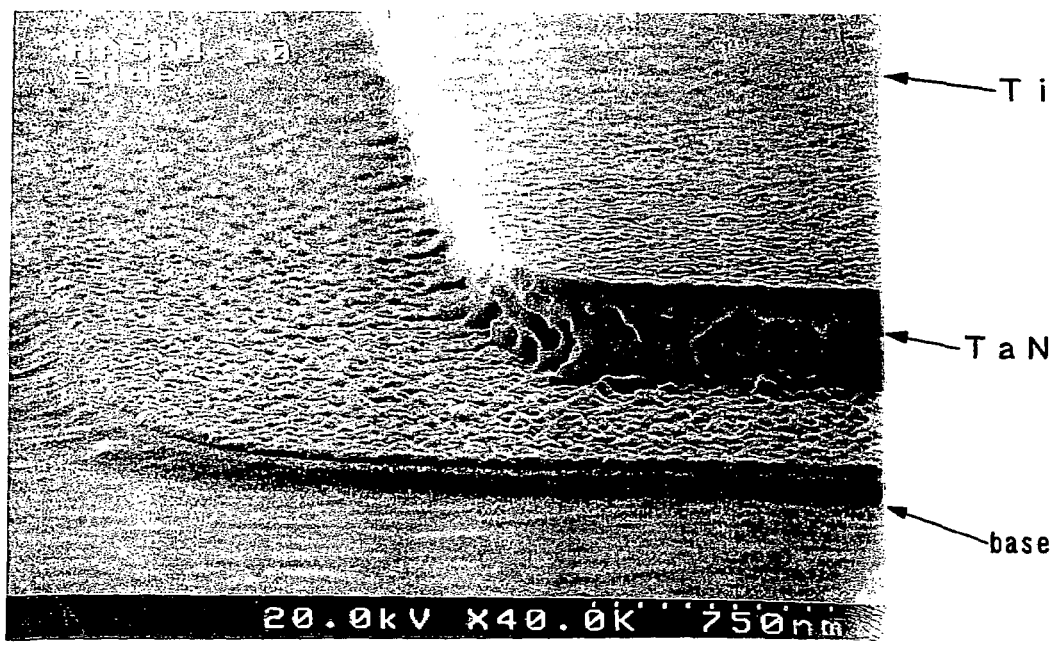

[Fig.9]
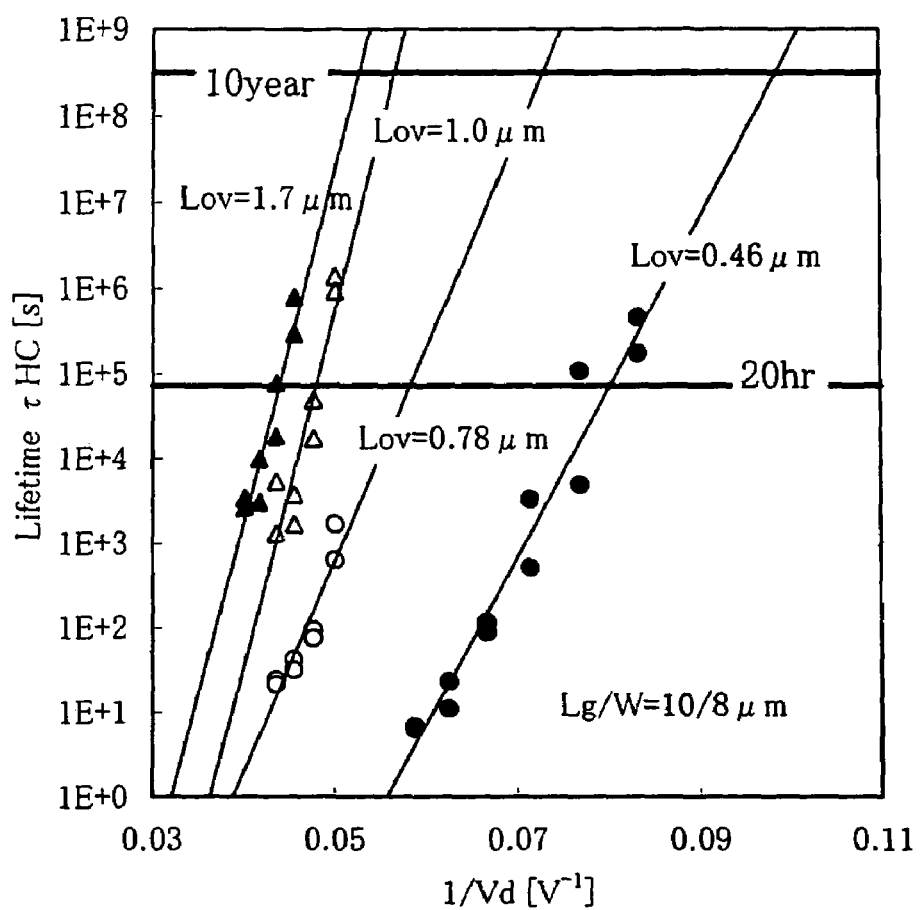

[Fig.10]
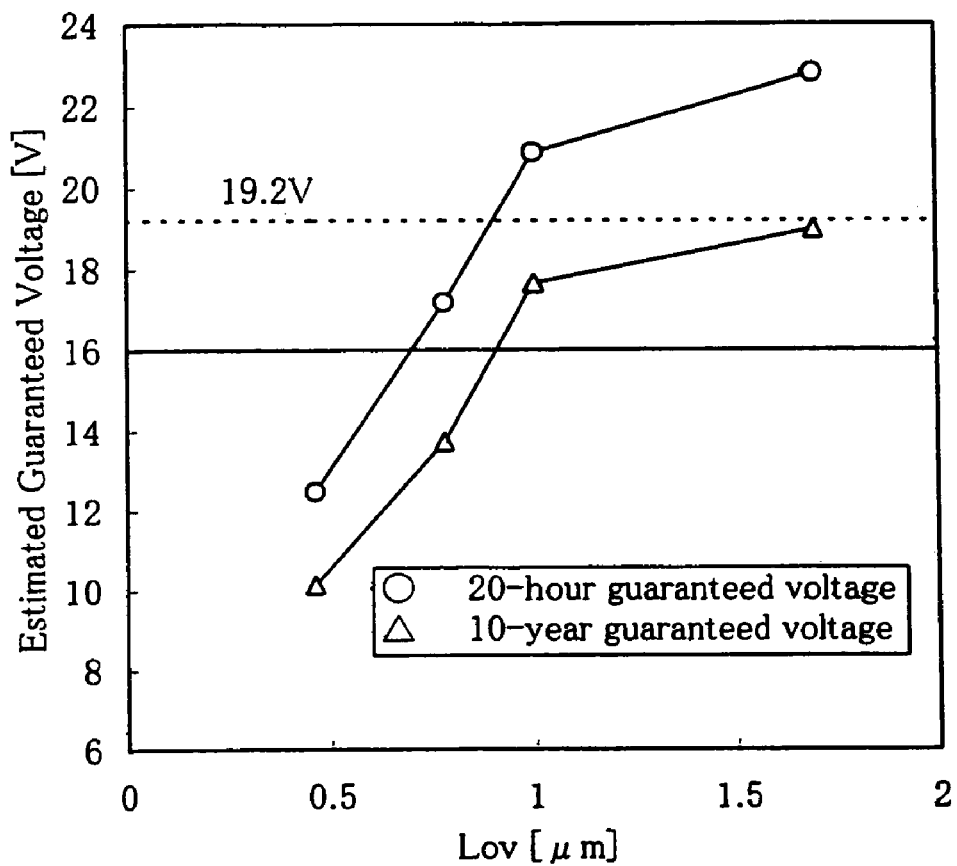

[Fig. 11]
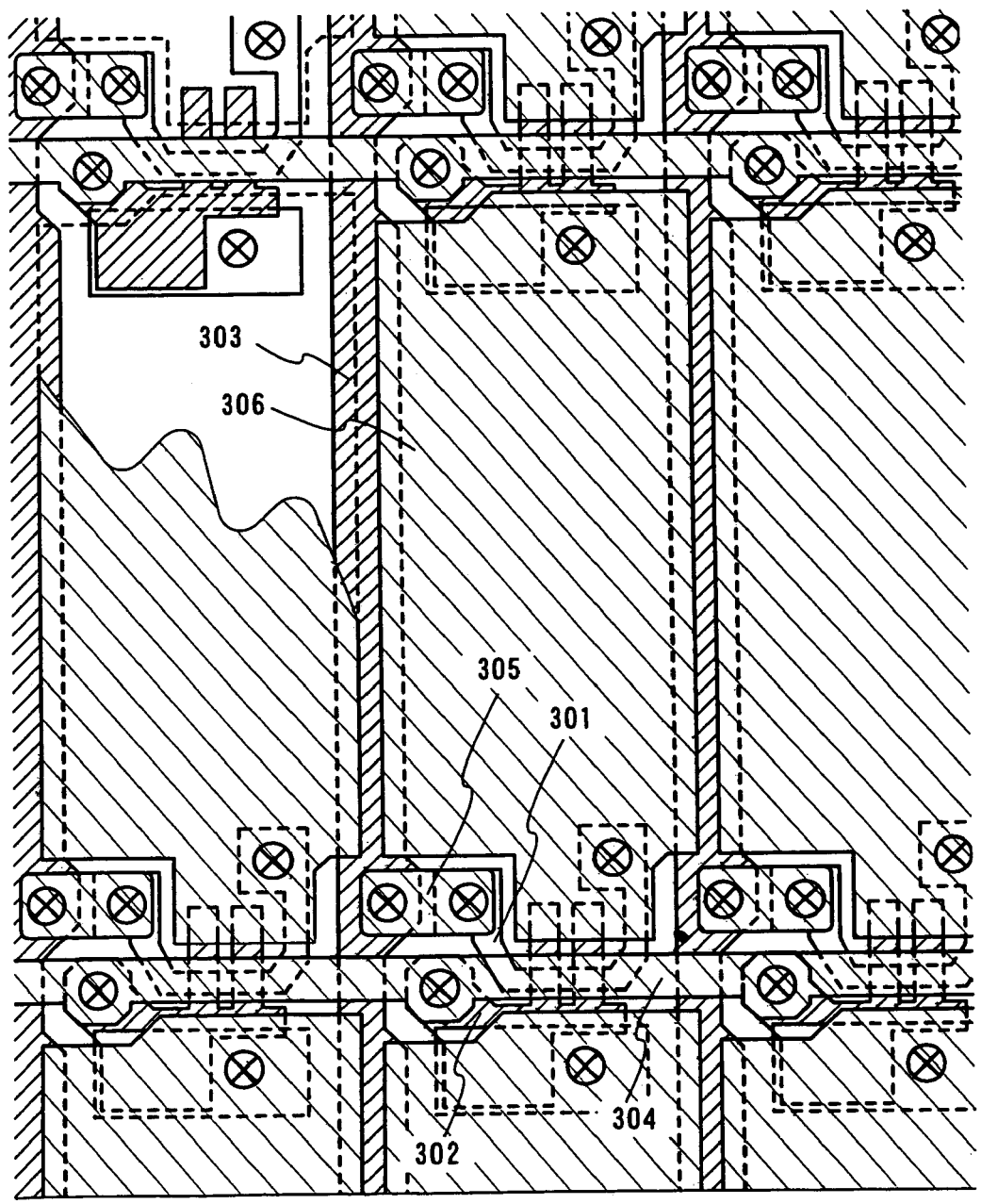

[Fig. 12]
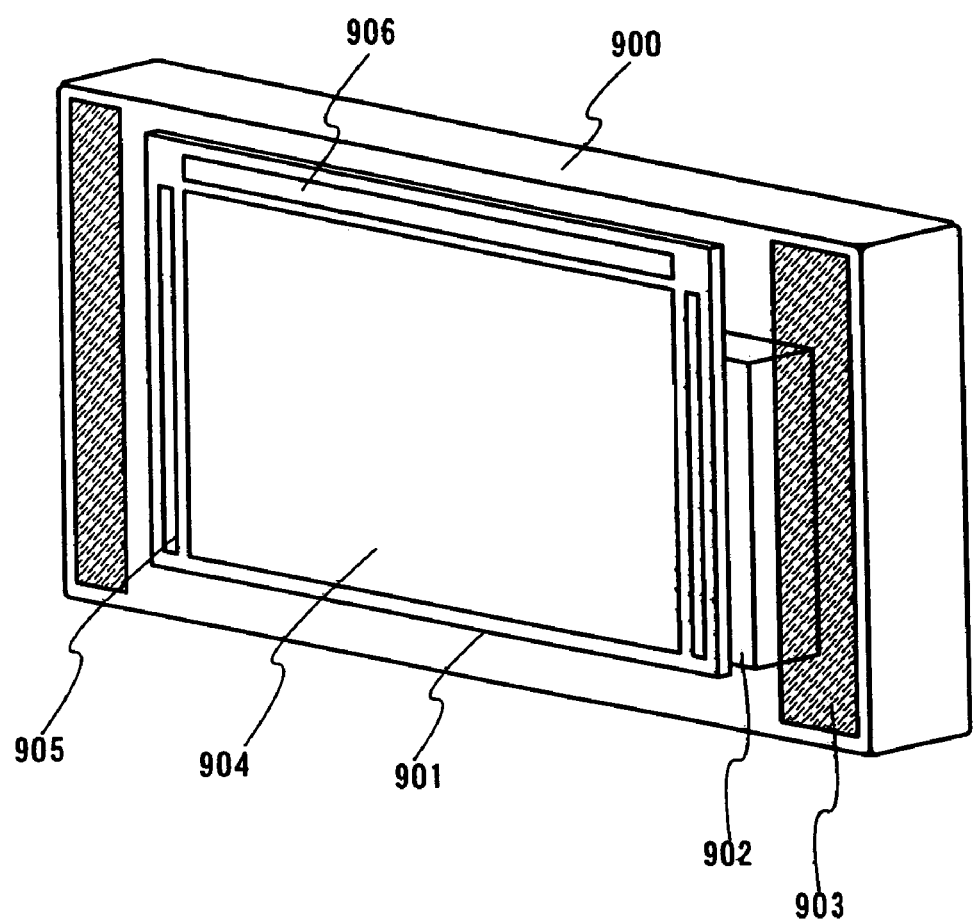

MANUFACTURING METHOD FOR SEMICONDUCTOR DEVICE

BACKGROUND OF THE INVENTION

1. Technical Field of the Invention

The present invention relates to a method of manufacturing an insulated gate field-effect transistor. In particular, the present invention relates to a method of manufacturing a semiconductor device, which can be applied to a thin film transistor (TFT) with a gate overlapping structure.

2. Description of the Related Art

In a display device using a liquid crystal, a part with a large-screen over 20 inches, which is typified in a liquid crystal display TV, has been put to practical use. In recent years, a liquid crystal display device integrated with a driving circuit has been realized with a TFT in which a polycrystalline silicon film is used as an active layer.

However, a defect is pointed out that a TFT using a polycrystalline silicon film has a low withstanding pressure in drain junction to increase junction leak current (hereinafter, OFF-leak current). It is known that it is effective to form a lightly doped drain (LDD: Lightly Doped Drain) structure as measures for the defect.

The phenomenon is pointed out as a problem that high electric field is generated in the vicinity of the drain region, then, a generated hot carrier is trapped by a gate insulating film on the LDD region, and then, device characteristics such as threshold voltage are greatly fluctuated and lowered. In order to prevent the deterioration due to hot carriers, a TFT in which a gate electrode is overlapped with an LDD region is disclosed (for example, refer to Japanese Patent Laid-Open No. 2000-294787). The TFT with the gate overlapped LDD structure has higher current driving ability compared to a TFT with a normal LDD structure, and effectively eases the high electric field in the vicinity of the drain region to suppress the deterioration due to hot carriers.

However, in the case of the TFT with the gate overlapped LDD structure disclosed in the above-mentioned publication, after an impurity region for forming an LDD region is formed in a semiconductor layer, a gate electrode is overlapped with the LDD region. Accordingly, the portion overlapping with the gate electrode cannot be accurately formed along with the miniaturization of design rule.

On the other hand, as a method for manufacturing a TFT with a gate overlapping LDD structure in a self-aligning manner, the technique is disclosed that a conductive layer that has at least two layer laminated is subjected to exposure once and etching plural times to make the upper layer and the lower layer have different sizes, and then, ion doping is conducted with utilizing the differences in size and thickness to form an LDD region overlapped with a gate electrode in self-aligning manner (for example, refer to Japanese Patent Laid-Open No. 2002-14337).

Of course, it is necessary that a length of the LDD (a length with respect to the channel length) is optimized in accordance with a driving voltage of the TFT in order to maximally show the function of the LDD overlapped with the gate electrode as measures against the deterioration due to hot carriers. Namely, there is an optimum length for effectively easing the high electric field in the vicinity of the drain region.

The technique disclosed in the above-mentioned Patent Document 2 has two steps; the first step of etching a conductive layer that has two laminated layers into a tapered shape and the second step of selectively subjecting only the upper layer of the conductive layer in the tapered shape to anisotropic etching, and is characterized in that a taper angle is controlled to enable controlling the length of the LDD.

3. Problem Solved by the Invention

For not only the gate electrode but also an edge portion or a sidewall portion of a film, it makes an etching process into a tapered-shape in accordance with a mask pattern possible that dry etching is used to etch the object to be processed while recessing a width of the mask pattern at the same time. For that purpose, the selection of a kind of gas for etching, the regulation of bias voltage, and the selective ratio of the film to a material of the mask pattern are important matters.

In the conventional technique using a gate electrode that has a laminated structure of at least two layers, it is necessary that a taper angle (an angle with a surface) of an edge be decreased in the stage of processing the gate electrode in order to control a length of the LDD. For that purpose, the mask pattern needs to be largely recessed. It is necessary to make the film thickness thicker to leave a margin since etching is performed to recess the mask pattern, which results in a problem that a microscopic mask pattern cannot be formed.

With respect to an issue concerning the selective ratio in the etching process, the relationship between etching gas and a material of the object to be processed needs to be considered.

In order to drive a TFT with a channel length on the order of 10 μm at 10 to 20 V, the TFT needs to have an LDD with a length (a length of a portion overlapping with a gate electrode) at least 1 μm (preferably, at least 1.5 μm). In this case, it is necessary to form a taper angle of approximately 20° with respect to a titanium film with 0.5 μm in thickness according to the above-mentioned conventional technique. However, since titanium is hard to be subjected to taper processing, such small taper angle cannot be formed by dry etching.

The present invention uses inexpensive titanium instead of expensive tungsten, and a gate electrode comprises a laminate that has a first conductive layer comprising tantalum nitride and a second conductive layer comprising titanium or one of an alloy and a compound including titanium as its main component. Alternatively, there is a case where titanium nitride is further laminated on the second conductive layer as a third conductive layer.

With respect to the selective ratio in the etching process, it is an object of the present invention to provide a technique for giving design freedom in size of an LDD overlapped with a gate electrode, which is formed in a self-aligning manner, and in particular, for manufacturing with a TFT that have excellent resistance to hot carriers with high repeatability by performing an etching process under an etching condition that has a high selective ratio between a mask pattern and one of titanium, an alloy including titanium as its main component, a compound including titanium as its main component, and titanium nitride (mask pattern/conductive layer) in forming a first conductive layer pattern.

SUMMARY OF THE INVENTION

The applicant has considered the length of an LDD overlapping with a gate electrode (hereinafter, referred to as Lov for the sake of convenience), which is necessary for controlling deterioration due to hot carriers, as follows.

First, the time until decrease of the maximum field-effect mobility by 10% is defined as lifetime in the case where the Lov is a predetermined value to degradation of a TFT, and the voltage at which the lifetime becomes ten years is derived as ten-year guaranteed voltage from a linear relationship obtained by plotting the reciprocal of a drain voltage on a semilogarithmic graph, as shown in FIG. 9. For example, in FIG. 9, the ten-year guaranteed voltage of a TFT with a Lov of 1.0 μm is 16 V. A high-voltage power source often has 16V in a liquid crystal panel, and it is required to obtain guaranteed voltage of 19.2 V or more, which has a margin of twenty percent. FIG. 10 is a graph in which thus obtained value of the estimated guaranteed voltage is plotted in the case where Lov has each of 0.5 μm, 0.78 μm, 1.0 μm, 1.5 μm, and 1.7 μm. FIG. 10 also shows a value of drain voltage as twenty-hour guaranteed voltage, at which the time until change in ON-state current of the TFT by 10% is 20 hours in a bias stress test.

Although degradation due to hot carrier effect is insignificant with low driving voltage, it becomes difficult to be negligible in the case of driving at 10 V or more. As is clear from FIG. 10, it is necessary to make the Lov 1 μm or more, preferably, 1.5 μm or more in the case of the driving voltage of 16 V.

In order to satisfy the above-mentioned requirement, the present invention provides a method for manufacturing a semiconductor device, which forms an LDD overlapping with a gate electrode in self-aligning manner, wherein a gate electrode is formed of a laminate that has a plurality of conductive layers, which is made into a shape in which a width of a lower first conductive layer is longer in the direction of a channel length than that of a second conductive layer, and the gate electrode is used as a mask during ion doping for forming the LDD. At this time, the present invention is characterized in that dry etching is performed under the condition that a mask pattern for forming the gate electrode is highly recessed to obtain an optimum shape, in order to make the LDD overlapping with the gate electrode, that is, Lov 1 μm or more, and preferably, 1.5 μm or more.

In the present invention, a laminated structure comprising a lower first conductive layer and an upper second conductive layer is formed over a semiconductor layer with a gate insulating film interposed therebetween, a mask pattern is formed on the laminated structure, a condition that an etching rate of the mask pattern is fast is used and the second conductive layer and the first conductive layer are etched to form a first conductive layer pattern that has a tapered edge, and the second conductive layer in the first conductive layer pattern is selectively etched in accordance with the mask pattern left on the first conductive layer pattern to form a second conductive layer pattern in which a width of the first conductive layer in the direction of a channel length is different from that of the second conductive layer and is longer. It becomes possible to make a projecting length of the first conductive layer 1 μm or more. When the second conductive layer in the second conductive layer pattern is used as a mask for shielding ions accelerated by an electric field, it becomes possible to form a lightly doped drain region in a region of the semiconductor film overlapping with the first conductive layer in the second conductive layer pattern. In other words, the lightly doped drain region can be formed in a self-aligning manner. Of course, the second conductive layer pattern can be used as a gate electrode.

In the above-mentioned configuration, an appropriate combination of the first and second conductive layers is that the first conductive layer is tantalum nitride and the second conductive layer is titanium or one of an alloy and a compound including titanium as its main component. In addition, plasma to which sulfur hexafluoride (SF$_6$) is added is appropriate for recessing an edge of the mask pattern on the second conductive layer.

In the present invention, first, second, and third conductive layers are sequentially laminated over a semiconductor layer with a gate insulating film interposed therebetween to form a laminated structure, a mask pattern is formed on the laminated structure, a condition that an etching rate of the mask pattern is fast is used and the first to third conductive layers are etched to form a first conductive layer pattern that has a tapered edge, and the third conductive layer and second conductive layer in the first conductive layer pattern are selectively etched in accordance with the mask pattern left on the first conductive layer pattern to form a second conductive layer pattern in which a width of the first conductive layer in the direction of a channel length is different from those of the second and third conductive layers and is longer. It becomes possible to make a projecting length of the first conductive layer 1 μm or more. When the third conductive layer and the second conductive layer in the second conductive layer pattern are used as a mask for shielding ions accelerated by an electric field, it becomes possible to form a lightly doped drain region in a region of the semiconductor film overlapping with the first conductive layer in the second conductive layer pattern. In other words, the lightly doped drain region can be formed in a self-aligning manner. Of course, the second conductive layer pattern can be used as a gate electrode.

In the above-mentioned configuration, an appropriate combination of the first to third conductive layers is that the first conductive layer is tantalum nitride, the second conductive layer is titanium or one of an alloy and a compound including titanium as its main component, and the third conductive layer is titanium nitride. In addition, plasma to which sulfur hexafluoride (SF$_6$) is added is appropriate for recessing an edge of the mask pattern on the third conductive layer.

As described above, in the case of forming a gate electrode of a laminated structure comprising a plurality of conductive layers to have a shape in which a width of a first conductive layer in the direction of a channel length is longer than that of a second conductive layer, it becomes possible to a hat-shaped structure in which a projecting length of the first conductive layer is 1 μm or more when an edge of a mask pattern is more recessed at a taper etching process. The use of the gate electrode as a mask during ion doping allows the length of an LDD region overlapping with the gate electrode to be 1 μm or more and to increase the lifetime against degradation due to hot carriers. Additionally, the same elements are given the same reference numerals throughout the embodiment described below.

BRIEF DESCRIPTION OF THE DRAWINGS

FIG. 1 shows sectional views for describing a process for making a semiconductor device according to the present invention;

FIG. 2 shows sectional views for describing a process for making the semiconductor device according to the present invention;

FIG. 3 shows diagrams for describing an effect of removing a reaction by-product by taper etching;

FIG. 4 shows diagrams for describing an effect of a reaction by-product in the case where the taper etching is not performed;

FIG. 5 is a diagram for describing a configuration of an ICP etching device;

FIG. 6 is a diagram for describing the relation between a recess width d of a second conductive layer and a length of Lov of a gate overlapping TFT;

FIG. 7 is an SEM image showing a shape of a conductive layer pattern subjected to an etching process;

FIG. 8 is an SEM image showing a shape of a conductive layer pattern subjected to an etching process;

FIG. 9 is a characteristic diagram for estimating a lifetime of a TFT in accordance with a bias stress test and a graph showing a dependency on Lov;

FIG. 10 is a graph showing a dependency of an estimated guaranteed voltage (10% deterioration of ON-state current) on a length of Lov;

FIG. 11 is a top view showing active-matrix type pixels of a semiconductor device according to the present invention; and FIG. 12 is a diagram showing an example of a semiconductor device.

DETAILED DESCRIPTION OF THE PREFERRED EMBODIMENTS

Hereinafter, an embodiment mode of the present invention will be described in detail with reference to drawings. It should be understood that the invention is not limited to the following embodiment mode and that various modifications are permitted without departing from the spirit and scope thereof.

In the present mode embodiment, a process will be described, in which a gate electrode comprising a laminate that has a first conductive film comprising tantalum nitride and a second conductive layer comprising titanium or one of an alloy and a compound including titanium as its main component is used as a mask during ion doping to form Lov in a self-aligning manner and make the length (Lov) 1 μm or more. More specifically, an mode will be described, in which etching is performed under the condition that a mask pattern is highly recessed in forming a first conductive layer pattern, and the second conductive layer in the first conductive layer pattern is selectively etched to form a second conductive layer pattern in accordance with the mask pattern thereon.

In FIG. 1(A), a first insulating film (base film) 101, a semiconductor layer 102, and a second insulating film (gate insulating film) 103 are formed on a glass substrate 100, and a first conductive layer 104 and a second conductive layer 105 are formed thereon. A mask pattern 106 is formed with the use of a photoresist according to photolithographic processing.

As the first conductive layer, a metal that has a high melting point such as tungsten (W), chromium (Cr), tantalum (Ta), tantalum nitride (TaN), or molybdenum (Mo) is formed to be a thickness from 30 to 50 nm, and the second conductive layer is formed of titanium or one of an alloy or a compound including titanium as its main component to be a thickness from 300 to 600 nm.

Next, as shown in FIG. 1(B), the second conductive layer 105 is etched by dry etching. As etching gas, gas of $CF_4$, $SF_6$, $Cl_2$, and $O_2$ is used. To increase an etching rate, a dry etching system that uses a high-density plasma source such as ECR (Electron Cyclotron Resonance) or ICP (Inductively Coupled Plasma) is used. In order to process an edge or a sidewall in a tapered shape in accordance with the mask pattern, a negative bias voltage is applied to the substrate side.

The mask pattern 106 formed of resist is sputtered by ions accelerated by an electric field, and a reaction by-product adheres to the sidewall of the workpiece. This is also called a sidewall protective film, and the reason why the second conductive layer including titanium as its main component is tapered in the process at this stage is to remove the sidewall protective film. Namely, since the reaction by-product is hardly deposited on the sidewall when anisotropic etching is thereafter performed to a tapered second conductive layer 105' as shown in FIG. 3(A), it is possible to perform the etching process without eliminating residue to form a pattern 105" as shown in FIG. 3(B). On the other hand, when the sidewall of the second conductive layer 105' is substantially vertical as shown in FIG. 4(A), a reaction by-product is deposited during the etching process, and the reaction by-product remains to cause malformation when an anisotropic etching is performed thereafter, as shown in FIG. 4(B). In other words, when at least the second conductive layer is tapered at this stage, the sidewall protective film can be removed.

Next, as shown in FIG. 1(C), the etching gas is changed to $CF_4$ and $Cl_2$ to etch tantalum nitride that is the first conductive layer.

In this way, a first conductive layer pattern 107 comprising first conductive layer 104' and second conductive layer 105' is formed on the second insulating film 103, as shown in FIG. 1(C). The angle made by the tapered shape at the edge and a surface of the substrate 100 is made 10 to 30 degrees. Although the angle is determined depending mainly on the relations with the film thickness of the second conductive layer, the length occupied by the tapered portion is made about 0.5 to 1.5 μm.

Then, with the use of $BCl_3$, $Cl_2$, and $O_2$ as etching gas, the second conductive layer 105' is selectively etched in accordance with a mask pattern 106'. In this case, the bias voltage to be applied to the substrate side is lowered to thereby leave the first conductive layer 104'. The edge of the second conductive layer 105' is recessed inward from the first conductive layer 104', and the length of Lov is determined depending on the recess amount, as will be described later. In this manner, a second conductive layer pattern 108 comprising the first conductive layer 104' and a second conductive layer 105" is formed, which becomes a gate electrode at a portion intersecting with the semiconductor layer 102 (FIG. 1(D)).

The addition of an impurity with one conductivity type to the semiconductor film 103, that is, the formation of an LDD and a source/drain region can be performed in a self-aligning manner with the use of the second conductive layer pattern 108. FIG. 2(A) shows a doping process for forming an LDD that overlaps with the gate electrode, wherein an ion of the impurity with the one conductivity type is made to pass through the first conductive layer 104' and added to the semiconductor layer 102 positioned in the lower layer portion to form an one conductivity type impurity region 109 with a first concentration. In this case, an acceleration voltage of 50 kV or more is required depending on the film thicknesses of the second insulating film and the first conductive layer. The concentration of the impurity in the impurity region of the one conductivity type impurity region 109 with the first concentration is set from $1\times10^{16}$ to $5\times10^{18}/cm^3$ (peak value) on the premise of the LDD.

In the doping process for forming the source/drain region, the second conductive layer pattern 108 is used as a mask for shielding ions and an one conductivity type impurity region 110 with a second concentration is formed outside the one conductivity type impurity region 109 with the first concentration. In this case, the acceleration voltage is set at 30 kV or less. The concentration of the impurity in the one conductivity type impurity region 110 with the second concentration is set at $1\times10^{19}$ to $5\times10^{21}/cm^3$ (peak value).

After that, a third insulating film 111 comprising silicon nitride, a fourth insulating film 112 comprising an organic compound material with a low-dielectric constant, and a wiring 113 are formed.

As described above, according to the present embodiment mode, it is possible to form an LDD overlapping with a gate electrode in a self-aligning manner and to form a TFT with the length (Lov) of 1 μm or more with the use of the gate electrode as a mask during ion doping. The length of the LDD region overlapping with the gate electrode is 1 μm or more to enable increasing the lifetime of the TFT against degradation due to hot carriers.

EXAMPLES

Example 1

In the present embodiment, an example of forming a gate electrode according to a process based on the embodiment mode will be described. The present embodiment will be described with reference to FIG. 1.

First, the first insulating layer 101 is formed of a silicon oxynitride film of 150 nm in thickness on the aluminosilicate-glass substrate with plasma CVD. The semiconductor layer 102 is formed of a crystalline silicon film for which an amorphous silicon film of 50 nm in thickness is crystallized by laser annealing so as to be isolated and separated into the shape of an island. As the second insulating film 103, a silicon oxynitride film of 115 nm in thickness is formed by plasma CVD with the use of $SiH_4$ and $N_2O$ as source gas. The first conductive layer 104 formed of tantalum nitride (TaN) is made 30 nm in thickness and the second conductive layer 105 formed of titanium is formed to be a thickness of 370 nm. The mask pattern 106 is formed of a positive photoresist to be a thickness of 1.5 μm. Although the width of the mask pattern may be set appropriately, photolithographic processing is performed with mask patterns with 4.5 μm and 10 μm in the present embodiment (FIG. 1(A)).

Next, the second conductive layer (titanium) 105 is etched by dry etching. For etching, an ICP etching system is used. FIG. 5 shows the configuration of the ICP etching system. A reaction chamber 801 is connected to a gas supply means 803 for etching and an exhaust means 804 for maintaining reduced pressure in the reaction chamber 801. A plasma generation means comprises a spiral coil 802 for inductively coupling to the reaction chamber 801 through a quartz plate and a high-frequency (13.56 MHz) power supply means 805. The application of bias voltage to the substrate side is conducted by a high-frequency (13.56 MHz) power supply means 806 to generate self-bias to a stage with the substrate thereon. For the etching process, the kind of etching gas to be supplied, high-frequency power supplied from each of the high-frequency (13.56 MHz) power supply means 806 and 807, and etching pressure are main parameters.

For the etching process in FIG. 1(B), $SF_6$ is added as etching gas in addition to $CF_4$, $Cl_2$, and $O_2$. The etching pressure is set at 1.3 Pa, and each of 800 W of power for generating plasma and 300 W of power for biasing the substrate is supplied. Subsequently, as shown in FIG. 1(C), the etching gas is changed to $CF_4$ and $Cl_2$ to etch tantalum nitride that is the first conductive layer. The etching condition in this case, each of 1.3 Pa of etching pressure and 500 W of power for generating plasma and 10 W of power for biasing the substrate is supplied. In this way, the first conductive layer pattern 107 can be formed.

Next, anisotropic etching is performed with the use of $BCl_3$, $Cl_2$, and $O_2$ as etching gas to process mainly the second conductive layer 105'. The etching pressure is set at 1.9 Pa, and each of 500 W of power for generating plasma and 3 W of power for biasing the substrate is supplied. The edge of the second conductive layer 105' is recessed inward from the edge of the first conductive layer 104'. In this way, the second conductive layer pattern 108 is formed, which becomes a gate electrode at a portion intersecting with the semiconductor layer 102. The recess width from the edge of the first conductive layer 104' can be made 1 μm or more. As shown in FIG. 6, the recess width d becomes a length that determines the length of Lov. Table 1 is a table comparing recess width d with or without the above-mentioned treatment of adding $SF_6$ in a similar process to the present embodiment.

As clearly shown in Table 1, the recess width of 1.351 μm can be obtained in the case with the treatment of adding $SF_6$, while the recess width is as small as 0.963 μm in the case without the treatment of adding $SF_6$.

TABLE 1

| | Lov length (one side) unit: μm | |
|---|---|---|
| mask pattern width | With the treatment of adding $SF_6$ | Without the treatment of adding $SF_6$ |
| 10.0 | 1.351 | 0.963 |

* conditions in the case with the treatment of adding $SF_6$ ICP/Bias = 800/300 W, 1.3 Pa, SF6/CF4/Cl2/O2 = 5/20/40/10 sccm
* conditions in the case without the treatment of adding $SF_6$ ICP/Bias = 800/300 W, 1.3 Pa, CF4/Cl2/O2 = 25/40/10 sccm Table 2 shows etching characteristics with respect to respective conditions. In order to recess a mask pattern highly, a selective ratio (P.R/Ti) of P.R (Resist) to Ti should be increased. Although the amount of $O_2$ is increased generally, Ti is oxidized to cause etch stop in the case of Ti. When the etching characteristic is searched in the case of $SF_6$ gas only, the selective ratio (P.R/Ti) of P.R to Ti can take 8.11, and also, the P.R and the Ti both can take large etch rates. This means that the selective ratio (P.R/Ti) can be gained when $SF_6$ is added.

TABLE 2

| condition | parameter | ICP W | Bias W | Press Pa | $CF_4$ sccm | $Cl_2$ sccm | $O_2$ sccm | P.R E/R AVE Å/min | P.R E/R p.n.u % | Ti E/R AVE Å/min | Ti E/R p.n.u % | TaN E/R AVE Å/min | TaN E/R p.n.u % | P.R/Ti selective ratio AVE | P.R/Ti selective ratio p.n.u % | Ti/TaN selective ratio AVE | Ti/TaN selective ratio p.n.u % |
|---|---|---|---|---|---|---|---|---|---|---|---|---|---|---|---|---|---|
| 1 | basal conc | 500 | 300 | 1.3 | 25 | 40 | 10 | 6932 | 8.5% | 3845 | 5.1% | 2662 | 3.6% | 1.81 | 11.5% | 1.44 | 4.6% |
| 2 | Bias | 500 | 100 | 1.3 | 25 | 40 | 10 | 6455 | 5.5% | 955 | 20.7% | 717 | 7.8% | 6.92 | 18.1% | 1.33 | 22.5% |
| 3 | | 500 | 200 | 1.3 | 25 | 40 | 10 | 6764 | 3.1% | 3113 | 6.8% | 1539 | 4.8% | 2.18 | 7.5% | 2.02 | 5.6% |

TABLE 2-continued

| con-dition | para-meter | ICP W | Bias W | Press Pa | CF$_4$ sccm | Cl$_2$ sccm | O$_2$ sccm | P.R E/R AVE Å/min | p.n.u % | Ti E/R AVE Å/min | p.n.u % | TaN E/R AVE Å/min | p.n.u % | P.R/Ti selective ratio AVE | p.n.u % | Ti/TaN selective ratio AVE | p.n.u % |
|---|---|---|---|---|---|---|---|---|---|---|---|---|---|---|---|---|---|
| 4 |  | 500 | 400 | 1.3 | 25 | 40 | 10 | 7694 | 3.9% | 3598 | 5.4% | 3513 | 3.8% | 2.14 | 6.9% | 1.02 | 8.2% |
| 5 | ICP | 300 | 300 | 1.3 | 25 | 40 | 10 | 5188 | 5.5% | 2297 | 8.2% | 2024 | 6.6% | 2.26 | 4.8% | 1.14 | 10.1% |
| 6 |  | 700 | 300 | 1.3 | 25 | 40 | 10 | 8777 | 8.1% | 3809 | 3.8% | 2306 | 5.9% | 2.31 | 10.7% | 1.65 | 8.3% |
| 7 |  | 500 | 300 | 1.8 | 25 | 40 | 10 | 7094 | 3.9% | 4285 | 6.5% | 1747 | 7.4% | 1.66 | 6.1% | 2.46 | 11.9% |
| 8 | Press | 500 | 300 | 2.3 | 25 | 40 | 10 | 8654 | 16.8% | 724 | 25.6% | 857 | 29.3% | 12.23 | 22.8% | 0.89 | 40.4% |
| 9 |  | 500 | 300 | 3.3 | 25 | 40 | 10 | 7659 | 21.2% | 2434 | 23.5% | 505 | 67.0% | 3.26 | 37.2% | 6.83 | 110.4% |
| 10 | O$_2$ | 500 | 300 | 1.3 | 25 | 40 | 15.0 | 9330 | 6.5% | 464 | 31.8% | 1179 | 13.4% | 21.06 | 34.7% | 0.40 | 31.5% |
| 11 |  | 500 | 300 | 1.3 | 25 | 40 | 7.5 | 6480 | 3.1% | 3832 | 4.2% | 3172 | 3.7% | 1.69 | 5.5% | 1.34 | 48.1% |
| 12 |  | 500 | 300 | 1.3 | 25 | 40 | 5.0 | 6037 | 4.7% | 3480 | 5.2% | 3061 | 8.1% | 1.74 | 9.9% | 1.14 | 10.3% |
| 13 |  | 500 | 300 | 1.3 | 25 | 40 | 0.0 | 5146 | 13.2% | 3091 | 6.2% | 3004 | 4.0% | 1.67 | 18.1% | 1.03 | 4.1% |
| 14 | CF$_4$/Cl$_2$ | 500 | 300 | 1.3 | 40 | 25 | 10 | 6571 | 16.6% | 0 | — | 1608 | 9.5% | ∞ | — | 0.00 | — |
| 15 |  | 500 | 300 | 1.3 | 30 | 35 | 10 | 7150 | 19.3% | 81 | 140% | 2047 | 5.8% | 42.90 | 20.3% | 0.04 | 134% |
| 16 |  | 500 | 300 | 1.3 | 20 | 45 | 10 | 6798 | 10.8% | 4036 | 4.8% | 3344 | 5.6% | 1.69 | 11.6% | 1.21 | 6.5% |
| 17 |  | 500 | 300 | 1.3 | 10 | 55 | 10 | 6238 | 13.4% | 2762 | 10.8% | 4498 | 5.8% | 2.27 | 21.0% | 0.61 | 9.4% |
| SF$_6$ treatment |  | 500 | 300 | 1.9 | SF$_6$ = 56 sccm | | | 10724 | 6.0% | 1337 | 17.2% | — | — | 8.11 | 14.1% | — | — |

FIGS. 7 and 8 are images through scanning electron microscopy (SEM), showing typical processed shapes respectively in the case with the treatment of adding SF$_6$ and the case without the treatment of adding SF$_6$, which each shows a state in which a tantalum nitride layer and a titanium layer are laminated from the bottom layer. Although the diagram shows the SEM images observed at an angle, a recess width of the titanium layer or a projecting width of the titanium nitride layer is estimated to be about 1.30 µm in the case with the treatment of adding SF$_6$ or about 0.80 µm in the case without the treatment of adding SF$_6$. With just replacing CF$_4$ by 5 sccm of SF$_6$, a dramatic effect can be obtained.

Thereafter, the one conductivity type impurity region 109 with the first concentration for forming the LDD is doped with phosphorous or boron at a concentration from $1\times10^{16}$ to $5\times10^{18}$ cm$^3$ (peak value) under an acceleration voltage of 50 kV by ion doping. (FIG. 2(A))

Besides, in the doping process for forming a source/drain region, the second conductive layer pattern 108 is used as a mask for shielding ions and the one conductivity type impurity region 110 with the second concentration is formed outside the one conductivity type impurity region 109 with the first concentration, in this case, at the acceleration voltage of 10 kV and the concentration of phosphorous or boron at $1\times10^{19}$ to $5\times10^{21}$/cm$^3$ (peak value). (FIG. 2(B))

After that, silicon oxynitride 111 containing hydrogen is formed with plasma CVD to be a thickness of 100 nm, and photosensitive or non-photosensitive acrylic or polyimide resin is formed to be a thickness of 1 µm, thereby forming the fourth insulating film 112. Furthermore, the wiring 113 is formed according to need.

In this way, the LDD overlapping with the gate electrode can be formed in a self-aligning manner, and also, the TFT with the length (Lov) of 1 µm or more can be formed.

Example 2

The present invention can apply to semiconductor devices in which various display screens are provided.

FIG. 12 is a structural example of a semiconductor device that has a display panel 901 mounted in a casing 900, which is applicable to television receivers and monitor systems of computers. In the casing 900, an electronic circuit board 902 and a speaker 903 for sound reproduction are loaded, wherein the electronic circuit board 902 incorporates an amplifier and a high-frequency circuit formed of a semiconductor integrated circuit, and a semiconductor memory or a magnetic memory such as a hard disk as a memory function to fulfill a function of displaying an image.

A display panel 901 can be comprising a driver-integrated type in which an active matrix pixel circuit 904 in which gate overlapping TFTs according to the present invention are used to arrange the TFT in a matrix shape, a scanning line driving circuit 905, and a data line driving circuit 906 are formed integrally.

FIG. 11 is a diagram showing a principal structure of the active matrix pixel circuit 904. A gate electrode 302 intersecting with a semiconductor layer 301 and a data signal line 303 are formed of the same layer, that is, which is formed of a laminate including at least a conductive layer including titanium as its main component, and an etching process for forming the gate electrode or the wiring pattern is performed according to Embodiment 1. In this manner, it is possible to form a gate overlapping TFT that has Lov with a length of 1 µm or more at low cost. A gate signal line 304 is formed in the above thereof with an interlayer insulating film interposed therebetween and has a structure in contact with the gate electrode 302 through a contact hole. Of course, this wiring can be formed of titanium and aluminum. It is also possible to form a wiring 305 that connects the data signal line 303 and the semiconductor layer 301 of the same layer as the gate signal line 304. A pixel electrode 306 is formed with the use of ITO (indium tin oxide) that is a compound of indium oxide and titanium oxide. The details of such pixels are disclosed in Japanese Patent Laid-Open 2001-313397.

In the present embodiment, an example has been shown in the semiconductor device. However, the invention is not limited to the present embodiment and can be applied to various semiconductor devices. It is possible to be applied to various fields, for example, in addition to navigation systems, sound reproducing systems (such as car audio systems and component audio systems), notebook-sized personal computers, game machines, personal digital assistants (such as mobile computers, cellular phones, portable game machines, and electronic books), electrical home appliances such as refrigerators, washing machines, rice cookers, fixed telephones, vacuum cleaners, and clinical thermometers, railroad wall banners, and information displays such as arrival and departure guide plates in railroad stations and airports.

Although the embodiments according to the invention have been described as above, it is to be understood by those skilled in the art that various changes and modifications may be made without departing from the spirit and scope of the present invention.

As described above, according to the present invention, in the process of forming a gate electrode of a laminate comprising a plurality of conductive layers to have a shape in which the width of a first conductive layer in the direction of a channel length is longer than that of a second conductive layer, it is possible to form a hat shaped structure in which the first conductive layer has a length of 1 µm or more in the direction of the channel length when a mask pattern is formed on the laminate comprising the first conductive film comprising tantalum nitride and the second conductive layer comprising titanium and an etching process is performed for forming a first conductive layer pattern comprising a long taper portion while increasing a recess amount of the mask pattern with the use of plasma in which $SF_6$ is added to $CF_4$, $Cl_2$, and $O_2$. The use of the gate electrode as a mask during ion doping allows the length of an LDD region overlapping with the gate electrode to be 1 µm or more and to increase the lifetime against degradation due to hot carriers.

According to the present invention, it is possible to form an LDD overlapping with a gate electrode in a self-aligning manner and to form a TFT with the length (Lov) of 1 µm or more with the use of the gate electrode as a mask during ion doping. The length of the LDD region overlapping with the gate electrode is 1 µm or more to enable increasing the lifetime of the TFT against degradation due to hot carriers.

What is claimed is:

1. A method for manufacturing a semiconductor device, comprising the steps of:
    forming a laminate comprising a lower first conductive layer and an upper second conductive layer over a semiconductor layer with a gate insulating film interposed therebetween;
    forming a mask pattern over the laminate;
    using a condition that has a fast etching rate of the mask pattern and etching the second conductive layer and the first conductive layer to form a tapered first conductive layer pattern;
    selectively etching the second conductive layer in the first conductive layer pattern in accordance with the mask pattern left over the first conductive layer pattern to form a second conductive layer pattern; and
    forming a lightly doped drain region in a region of the semiconductor film overlapping with the first conductive layer in the second conductive layer pattern with the second conductive layer in the second conductive layer pattern as a mask for shielding ions accelerated by an electric field.

2. The method according to claim 1, wherein the first conductive layer is tantalum nitride, and the second conductive layer is titanium or one of an alloy and a compound including titanium as its main component.

3. The method according to claim 1, wherein the second conductive layer and the first conductive layer are etched while recessing the mask pattern over the laminate with the use of plasma to which sulfur hexafluoride is added to form the tapered first conductive layer pattern.

4. A method for manufacturing a semiconductor device, comprising the steps of:
    laminating a first conductive layer, a second conductive layer, and a third conductive layer sequentially over a semiconductor layer with a gate insulating film interposed therebetween to form a laminate;
    forming a mask pattern over the laminate;
    using a condition that has a fast etching rate of the mask pattern and etching the third conductive layer, the second conductive layer, and the first conductive layer to form a tapered first conductive layer pattern;
    selectively etching the third conductive layer and the second conductive layer in the first conductive layer pattern in accordance with the mask pattern left over the first conductive layer pattern to form a second conductive layer pattern; and
    forming a lightly doped drain region in a region of the semiconductor film overlapping with the first conductive layer in the second conductive layer pattern with the third conductive layer and the second conductive layer in the second conductive layer pattern as a mask for shielding ions accelerated by an electric field.

5. The method according to claim 4, wherein the first conductive layer is tantalum nitride, the second conductive layer is titanium or one of an alloy and a compound including titanium as its main component, and the third conductive layer is titanium nitride.

6. The method according to claim 4, wherein the first to third conductive layers are etched while recessing the mask pattern over the laminate with the use of plasma to which sulfur hexafluoride is added to form the tapered first conductive layer pattern.

7. A method for manufacturing a semiconductor device, comprising the steps of:
    forming a laminate comprising a lower first conductive layer and an upper second conductive layer over a semiconductor layer with a gate insulating film interposed therebetween;
    forming a mask pattern over the laminate;
    etching the second conductive layer and the first conductive layer while recessing the mask pattern over the laminate with the use of plasma to which sulfur hexafluoride is added to form a tapered first conductive layer pattern;
    selectively etching the second conductive layer in the first conductive layer pattern in accordance with the mask pattern left over the first conductive layer pattern to form a second conductive layer pattern; and
    forming a lightly doped drain region in a region of the semiconductor film overlapping with the first conductive layer in the second conductive layer pattern with the second conductive layer in the second conductive layer pattern as a mask for shielding ions accelerated by an electric field.

8. The method according to claim 7, wherein the first conductive layer is tantalum nitride, and the second conductive layer is titanium or one of an alloy and a compound including titanium as its main component.

9. A method for manufacturing a semiconductor device, comprising the steps of:
    laminating a first conductive layer, a second conductive layer, and a third conductive layer sequentially over a semiconductor layer with a gate insulating film interposed therebetween to form a laminate;
    forming a mask pattern over the laminate;

etching the third conductive layer, the second conductive layer, and the first conductive layer while recessing the mask pattern over the laminate with the use of plasma to which sulfur hexafluoride is added to form a tapered first conductive layer pattern;

selectively etching the third conductive layer and the second conductive layer in the first conductive layer pattern in accordance with the mask pattern left over the first conductive layer pattern to form a second conductive layer pattern; and forming a lightly doped drain region in a region of the semiconductor film overlapping with the first conductive layer in the second conductive layer pattern with the third conductive layer and the second conductive layer in the second conductive layer pattern as a mask for shielding ions accelerated by an electric field.

10. The method according to claim 9, wherein the first conductive layer is tantalum nitride, the second conductive layer is titanium or one of an alloy and a compound including titanium as its main component, and the third conductive layer is titanium nitride.

11. A method for manufacturing a semiconductor device, comprising the steps of:

forming a laminate comprising a lower first conductive layer and an upper second conductive layer over a semiconductor layer with a gate insulating film interposed therebetween;

forming a mask pattern over the laminate;

using a condition that has a high selective ratio of the mask pattern to the second conductive layer and etching the second conductive layer and the first conductive layer to form a tapered first conductive layer pattern;

selectively etching the second conductive layer in the first conductive layer pattern in accordance with the mask pattern left over the first conductive layer pattern to form a second conductive layer pattern; and forming a lightly doped drain region in a region of the semiconductor film overlapping with the first conductive layer in the second conductive layer pattern with the second conductive layer in the second conductive layer pattern as a mask for shielding ions accelerated by an electric field.

12. The method according to claim 11, wherein the first conductive layer is tantalum nitride, and the second conductive layer is titanium or one of an alloy and a compound including titanium as its main component.

13. The method according to claim 11, wherein the second conductive layer and the first conductive layer are etched while recessing the mask pattern over the laminate with the use of plasma to which sulfur hexafluoride is added to form the tapered first conductive layer pattern.

14. A method for manufacturing a semiconductor device, comprising the steps of:

laminating a first conductive layer, a second conductive layer, and a third conductive layer sequentially over a semiconductor layer with a gate insulating film interposed therebetween to form a laminate;

forming a mask pattern over the laminate;

using a condition that has a high selective ratio of the mask pattern to the second conductive layer and etching the third conductive layer, the second conductive layer, and the first conductive layer to form a tapered first conductive layer pattern;

selectively etching the third conductive layer and the second conductive layer in the first conductive layer pattern in accordance with the mask pattern left over the first conductive layer pattern to form a second conductive layer pattern; and forming a lightly doped drain region in a region of the semiconductor film overlapping with the first conductive layer in the second conductive layer pattern with the third conductive layer and the second conductive layer in the second conductive layer pattern as a mask for shielding ions accelerated by an electric field.

15. The method according to claim 14, wherein the first conductive layer is tantalum nitride, the second conductive layer is titanium or one of an alloy and a compound including titanium as its main component, and the third conductive layer is titanium nitride.

16. The method according to claim 14, wherein the third conductive layer, the second conductive layer, and the first conductive layer are etched while recessing the mask pattern over the laminate with the use of plasma to which sulfur hexafluoride is added to form the tapered first conductive layer pattern.

* * * * *